United States Patent [19]

Rubloff et al.

[11] Patent Number: 5,290,358
[45] Date of Patent: Mar. 1, 1994

[54] APPARATUS FOR DIRECTIONAL LOW PRESSURE CHEMICAL VAPOR DEPOSITION (DLPCVD)

[75] Inventors: Gary W. Rubloff, Waccabuc; Julian J. Hsieh, Bronx, both of N.Y.

[73] Assignee: International Business Machines Corporation, Armonk, N.Y.

[21] Appl. No.: 954,633

[22] Filed: Sep. 30, 1992

[51] Int. Cl.$^5$ .................................................. C23C 16/00
[52] U.S. Cl. .................................... 118/715; 118/720; 118/725; 427/248.1; 156/613; 437/90; 437/235; 437/237
[58] Field of Search ................... 118/720, 725, 715; 427/248.1; 156/613; 437/100, 235, 237

[56] References Cited

U.S. PATENT DOCUMENTS

| | | | |
|---|---|---|---|
| 3,092,522 | 6/1963 | Knowles et al. | 148/15 |
| 3,908,262 | 9/1975 | Stein | 29/579 |
| 3,951,708 | 4/1976 | Dean | 156/3 |
| 4,211,582 | 7/1980 | Horng et al. | 148/1.5 |
| 4,310,567 | 1/1982 | Tabata et al. | 427/82 |
| 4,422,888 | 12/1983 | Stutius | 148/175 |
| 4,477,489 | 10/1984 | Yanai et al. | 427/132 |
| 4,525,971 | 7/1985 | Fabian | 29/571 |
| 4,617,088 | 10/1986 | Nishiguchi et al. | 156/656 |
| 4,625,678 | 12/1986 | Shioya et al. | 118/725 |
| 4,756,793 | 7/1988 | Peek | 156/640 |
| 4,788,082 | 11/1988 | Schmitt | 427/248 |
| 4,838,201 | 6/1989 | Fraas et al. | 118/725 |
| 4,878,989 | 11/1989 | Purdes | 118/725 |
| 4,883,770 | 11/1989 | Dohler et al. | 437/110 |
| 4,986,216 | 1/1901 | Ohmori et al. | 118/725 |
| 5,002,630 | 3/1991 | Kermani et al. | 156/614 |
| 5,156,820 | 10/1992 | Wong et al. | 118/725 |

FOREIGN PATENT DOCUMENTS

| | | | |
|---|---|---|---|
| 60-58653 | 4/1985 | Japan | 437/237 |
| 63-174310 | 7/1988 | Japan | 437/105 |
| 433329 | 2/1992 | Japan | 118/725 |

OTHER PUBLICATIONS

The LPCVD of silicon oxide films below 400° C. from liquid sources by Hochberg et al., in J. Elec Chem Soc 136(6), 1989, pp. 1843 1844.

A transmission electron microscopy study of low temperature reaction at the Co-Si interface by Ruterana in J. Appl. Phys 68(3), Aug. (1990), p. 1033.

M. L. Yu and B. N. Eldridge, "Supersonic Reactive Gas Jet Chemical Processing", IBM TDB, vol. 35, No. 2, Jul. 1992, pp. 402–403.

*Primary Examiner*—Olik Chaudhuri
*Assistant Examiner*—Ramamohan Rao Paladugu
*Attorney, Agent, or Firm*—Thomas P. Dowd; Daniel P. Morris

[57] ABSTRACT

System and method for controlling the thickness profile of deposited thin film layers over three-dimensional topography are disclosed, wherein low pressure chemical vapor deposition conditions are employed with the reactant beam collimated and chosen to impinge at a specific angle onto the surface, such that the reactive sticking coefficient $s_r$ with the deposition surface is <1. Compared with conventional approaches, this method permits new shapes of the deposited thin film layer to be achieved over topography (such as trenches), including (i) tapered rather than re-entrant shapes (i.e., thicker at bottom rather than at top), (ii) enhanced sidewall and/or bottom coverage of trench structures (cf. the top surface), (iii) voidless, seamless filling of trench or via structures even at high aspect ratio (depth/width), and (iv) asymmetric sidewall coverage.

15 Claims, 6 Drawing Sheets

NORMAL INCIDENCE

OBLIQUE INCIDENCE

GOOD CONFORMALITY
AR ≅ 1.0

POOR CONFORMALITY
AR >> 1.0

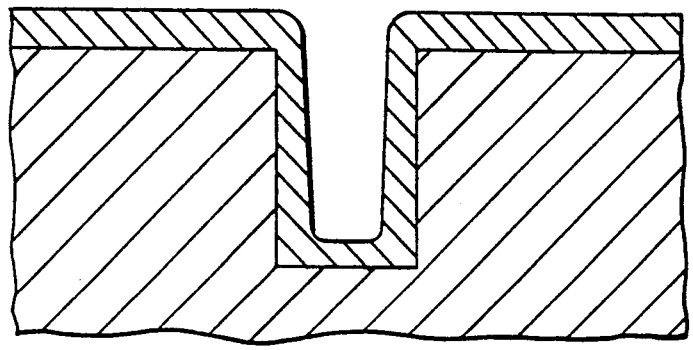
FIG. 3a
TAPERED
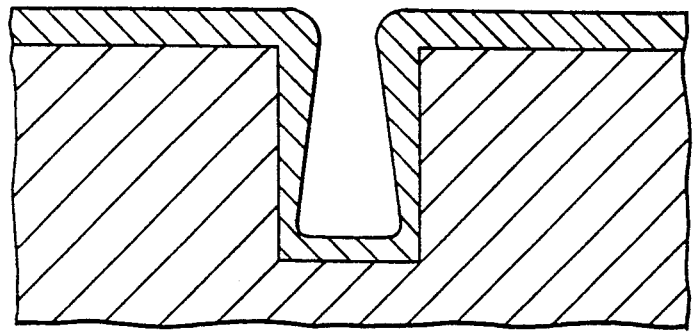
FIG. 3b
RE-ENTRANT
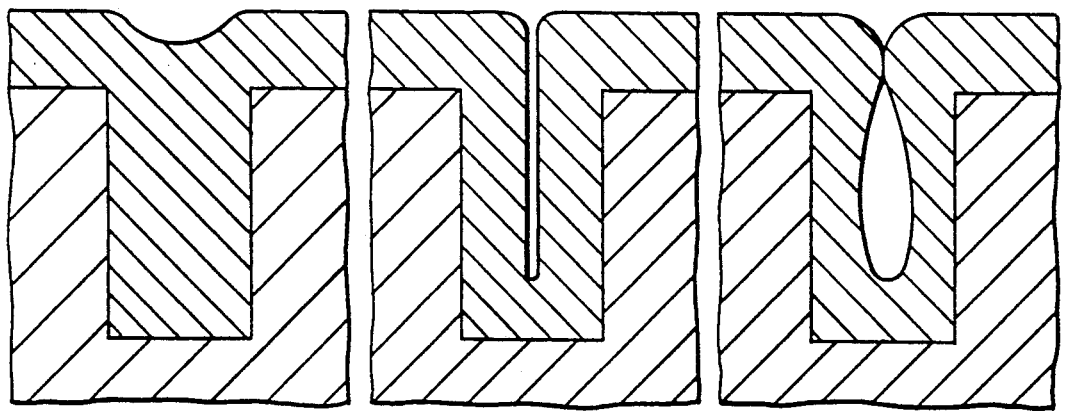
FIG. 4a
IDEAL
FIG. 4b
SEAM
FIG. 4c
VOID

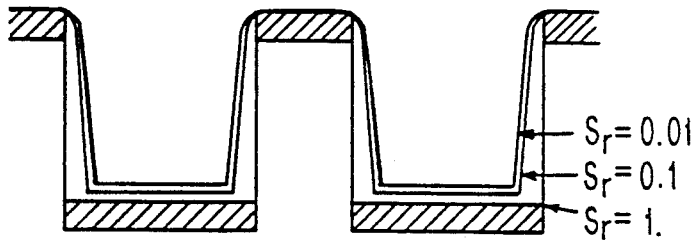
FIG. 8a
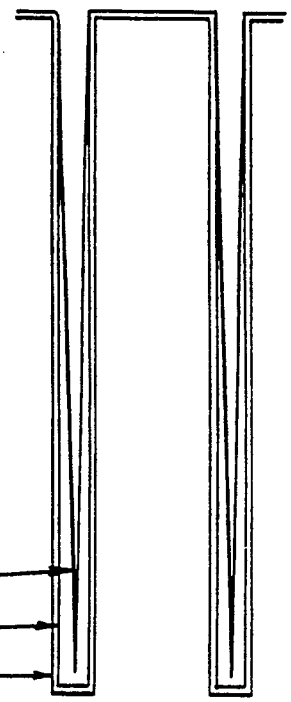
FIG. 8b
FIG. 9

APPARATUS FOR DIRECTIONAL LOW PRESSURE CHEMICAL VAPOR DEPOSITION (DLPCVD)

BACKGROUND OF THE INVENTION

1. Field of the Invention

The present invention relates to semiconductor fabrication, and particularly to a system and method for controlling the thickness distribution of chemically deposited thin film layers over three-dimensional topography on the scale of 0.1-10 μm, such dimensions being characteristic of features used in semiconductor devices.

More specifically, the invention relates to the challenges presented by the surface of a semiconductor which, before the deposition, contains trench or via structures protruding down into the surface and having for example rectangular (trench) or circular (via) shapes as viewed from above. The two shapes will be referred to interchangeably throughout this description. The lateral dimension of such structures is hereafter referred to as the width of the trench or via; the vertical dimension of such structures is referred to as the depth. The aspect ratio AR of the trench or via is the ratio of depth to width. The invention is directed to providing a process that offers the capability of controlling deposited layer profiles over such three-dimensional trench or via structures, and particularly the ability to choose how the thickness of the deposited layer varies with position along the surface of the trench bottom or sidewall surface, as well as with respect to the thickness deposited on the top surface next to the trench.

2. Prior Art and Problem to be Solved

The geometry of a trench and of a deposited overlayer structure is depicted schematically in FIGS. 1(a) and 1(b), respectively. In FIG. 1(a) a semiconductor substrate with a three-dimensional trench or via structure having a depth d and width w is shown in cross-section, while a thin film overlayer on the top, sidewall, and bottom surfaces is illustrated in FIG. 1(b) with thickness dimensions $t_t$, $t_s$, and $t_b$, respectively. The step coverage SC is conventionally defined as the ratio of sidewall to top coverage, i.e., $SC = t_s/t_t$.

Overlayer deposition processes provide differing degrees of conformality as indicated in FIGS. 2(a) and 2(b), which schematically show the conformality of deposited layers on trench structures of different ARs. In FIG. 2(a), where $AR \approx 1.0$, the sidewall coverage is nearly equal to the top coverage, and consequently conformality is very good. In FIG. 2(b) the higher aspect ratio $AR >> 1.0$ causes sidewall coverage to be smaller with increasing depth into the trench, and the resulting conformality is poor. The high conformality coverage of FIG. 2(a) is typically that achieved with chemical deposition mechanisms. The poor conformality of FIG. 2(b) is more commonly found with physical deposition techniques in which the impinging flux on the feature surface is limited by geometrical shadowing. In many—if not most—cases, conformal coverage is desired. For example, if the deposited layer is a dielectric used to electrically isolate a material subsequently put into the trench over the dielectric, thinner regions on the sidewall would represent a serious yield and reliability detractor.

Typically, the sidewall coverage will not be uniform along its height. Such variations are illustrated in FIGS. 3(a) and (b), which respectively show (a) tapered and (b) re-entrant sidewall profiles of deposited thin films or layers of finite conformality. The tapered shape has thicker sidewall coverage toward the bottom of the sidewall than toward the top, while the situation is reversed for the re-entrant shape. Generally speaking the tapered shape is more desireable than the re-entrant, because the overhang of deposited material near the top of the trench shadows the region below, and the consequences of subsequent deposition can be ill-defined. With tapered or re-entrant shapes, the step coverage may ned to be defined more precisely, but one can refer to it simple in terms of the average sidewall coverage.

When the deposited film is employed to completely fill the trench structure, as shown in FIG. 4, three different results can emerge as illustrated by cases (a), (b), and (c). In case (a) the deposited material fills the trench without leaving a seam or void. In case (b) a seam is shown, arising from the point where the sidewall layers merge during deposition. In case (c) a void is depicted, which can readily arise if the deposition produces re-entrant profiles at earlier stages of the filling process. For integrity and reliability microelectronic structures, case (a) is ideal. The cases of remaining seams (b) and voids (c) are undesireable, since chemicals or materials may be present in the seam or void to corrode or degrade the structure. Furthermore, voids are rarely hermetically sealed, so subsequent exposure to chemicals or materials deposition can alter the material structure substantially. Deposition onto trench and via structures is commonly practiced at several stages in the fabrication of semiconductor devices and interconnections. Most often the objective is to provide rather highly conformal films or void-free (and possibly seam-free) filling. The problem and challenge presented is that of increasing aspect ratio trench structures, consistent with the trend toward higher lateral device density.

Low pressure chemical vapor deposition (LPCVD) is widely used to achieve conformal deposition of microelectronic films over topography. Physical vapor deposition techniques (evaporation, sputter-deposition) are typically limited to low AR (<2) since they involve relatively collimated or directional impinging beams with sticking coefficients $s_r \approx 1.0$. LPCVD processes offer much better conformality and filling properties for several reasons.

First, the reactive species in the gas phase exhibit isotropic impingement properties, so that they can impinge on sidewalls substantially.

Second, the chemical processes involved provide intermediate species, some of which may be mobile on the surface and thereby may migrate to sidewalls and bottom trench surfaces. Third, the reaction probability of chemical reactants hitting the surface may be <1.0, in contrast to the case of physical vapor deposition, so that some species bounce off the surface to impinge on neighboring surfaces in the trench from different angles, a phenomenon called redeposition. Indeed, conformal deposition can be achieved with very high AR (~40), as has been found with CVD $Si_3N_4$ deposition for triple-layer dielectrics in dynamic RAM trench capacitors, or with the subsequent filling of high AR trenches with polycrystalline Si films by CVD. The important distinction is that CVD processes involve isotropic impingement of reactant species together with reactive sticking coefficients $s_r$ (i.e., reaction probabilities) which are less than unity.

Current CVD processes have important limitations. With higher integration levels or higher performance structures, higher aspect ratios are required, stretching the ability of known CVD processes. Re-entrant profiles, seams, and voids all endanger the manufacturability of the semiconductor product due to yield and reliability problems. Where higher growth temperatures improve conformality or profiles, other properties of the 3-D structure may be degraded (e.g., abrupt doping profiles due to diffusion). Alternatively, lower reaction probabilities ("reactive sticking coefficient") for well-chosen CVD chemistries can yield higher conformality, but throughput is degraded, making the approach less competitive. Thus, conventional CVD processes may not be capable of achieving the 3-D profiles and filling characteristics needed for next-generation technologies.

OBJECTS OF THE INVENTION

Accordingly, it is an object of the present invention to provide a means by which deposition profiles in trench or via structures can be improved, whether thin layers or trench filling are being produced. Furthermore, it is an object of the invention to enable the fabrication of three-dimensional shapes or profiles of the deposited thin film layer which are not possible using conventional chemical vapor deposition or physical vapor deposition as currently known and practiced.

More specifically, it is intended to make possible the deposition of thin films into trenches or vias such that high conformality is achieved, and that tapered profiles of the deposited overlayer may be realized. In addition, it is an object of the invention to provide a means to achieve complete filling of trench or via structures by the thin film deposited material such that voids and seams are not incorporated or formed in the material. These objects are critical to the advance of semiconductor device and interconnection technology. Finally, it would be of potential benefit to be able to coat one sidewall with a higher coverage than that on the opposite sidewall, in order to provide flexibility for the fabrication of novel device structures.

SUMMARY OF THE INVENTION

The present invention, involves directional low pressure chemical vapor deposition (DLPCVD), and particularly a system or apparatus and method for providing considerably greater flexibility and efficiency in fabricating desired film profiles over 3-dimensional topography. The invention exploits the non-unity sticking property (reactive sticking coefficient $s_r < 1.0$) of CVD chemicals to deposit materials over microscopic surface features to achieve precise deposition, e.g., in via filling.

FIGS. 5(a) and 5(b) show the scattering properties obtainable by using a directional CVD ($s_r < 1.0$) beam at a specified angle to a trench structure, here at normal incidence in FIG. 5(a) and at oblique incidence in FIG. 5(b). New reactant trajectories are generated by reflected species, which then impinge on difference portions and at different angles over the 3-dimensional microscopic topography. The invention exploits and combines three key factors, i.e., a low pressure reactor, CVD reactants, and directional beam deposition. More particularly, 1. Low pressures are used (∼1-10 torr or less) so that the means free path in the gas phase is long as compared to dimensions that are characteristic of the microfeatures being fabricated. This assures that gas phase scattering within the trench is negligible, and therefore that the distribution of incident directions of reactant onto the trench feature is maintained until scattering or reaction occur on the surfaces of the trench.

2. CVD reactants are employed, so that the reactive sticking coefficient of impinging species is $s_r < 1.0$. As shown in FIGS. 5(a) and 5(b) significant fractions of reactant are scattered and contribute to new impingement angles and positions on the 3-dimensional structure. The constraint on $s_r$ distinguishes the approach from any based on physical vapor deposition, where $s_r = 1.0$ typically. Depending on the chemistry of the process, volatile reaction products from the initial surface interaction may lead to deposition of species on the sidewalls as well (although the material properties may be different).

3. The supply of CVD reactants to the surface is delivered as a directional beam. Such a beam can be made by passing the precursor gases through a capillary array, for example. By choosing the reactant angle of incidence to the macroscopic target surface, considerable variation in film morphology can be achieved. A process using a directional CVD beam represents a fundamentally different instrumentality from conventional CVD, wherein an isotropic distribution of incident angles is expected to first order and many unique consequences achievable with the present invention are precluded.

BRIEF DESCRIPTION OF THE DRAWINGS

FIGS. 3(a) and 3(b) illustrate tapered (a) and re-entrant (b) shapes for deposited layers of finite conformality.

FIG. 4 illustrates characteristic CVD filling properties, including (a) ideal (i.e., seamless and voidless), (b) seam remaining, and (c) void remaining.

FIGS. 8(a) and 8(b) show deposited profiles for trench structures with aspect ratios of unity (a) and 20 (b), calculated for various sticking coefficients for CVD reactant flux normal to the macroscopic surface.

FIG. 9 shows deposited profiles for trench structures with aspect ratio unity, calculated at various sticking coefficients for CVD reactant flux oblique to the macroscopic surface (at 45° angle of incidence).

DETAILED DESCRIPTION OF THE PREFERRED EMBODIMENTS

The present invention is embodied in a system or apparatus and method for controlling the thickness profile of deposited thin film layers over three-dimensional topography, wherein low pressure chemical vapor deposition (LPCVD) conditions are employed with a reactant beam that is collimated and chosen to impinge at a specific angle onto the deposition surface. As compared with conventional approaches, the invention permits new shapes of the deposited thin film layer to be achieved over varying topography, such as trenches, which shapes include, for example, (i) tapered rather than re-entrant shapes (i.e., thicker at the bottom rather than at the top), (ii) enhanced sidewall and/or bottom coverage of trench structures (cf. the top surface), (iii) voidless, seamless filling of trench or via structures even at high aspect ratio (depth/width), and (iv) asymmetric sidewall coverage.

Figure 1A:
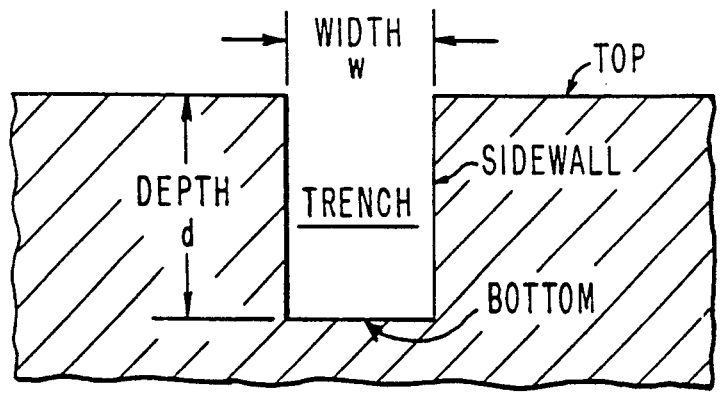
FIGS. 1(a) and 1(b) are schematic diagrams of a vertical cross-section of a three-dimensional trench or via structure prior to and after the deposition of a thin film over its surface.
Figure 1B:
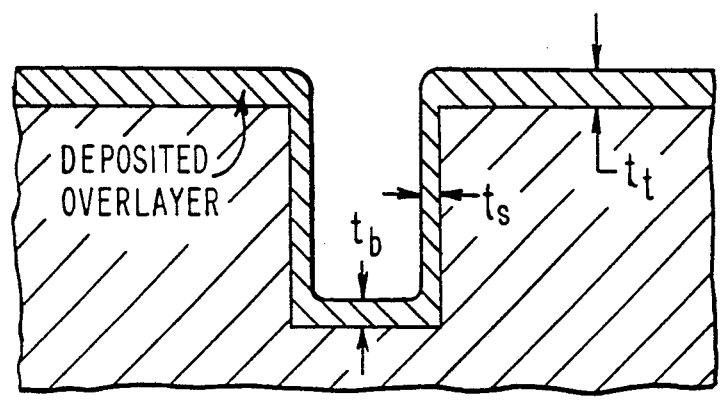
Figure 2A:
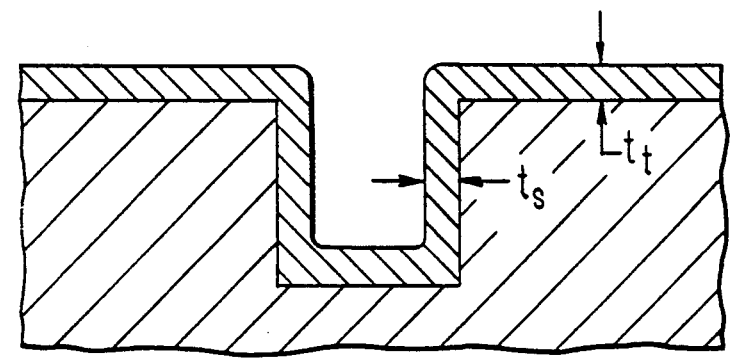
FIGS. 2(a) and 2(b) are schematic diagrams illustrating different conformalities of deposited layers on trench structures of the type shown in FIGS. 1(a) and 1(b) but with different aspect ratios, i.e., $AR \approx 1.0$ in FIG. 2(a) and a higher aspect ratio $AR >> 1.0$ in FIG. 2(b).
Figure 2B:
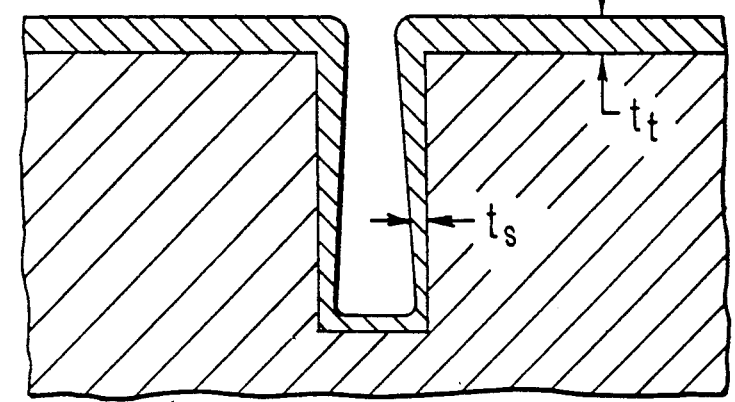
Figure 5A:
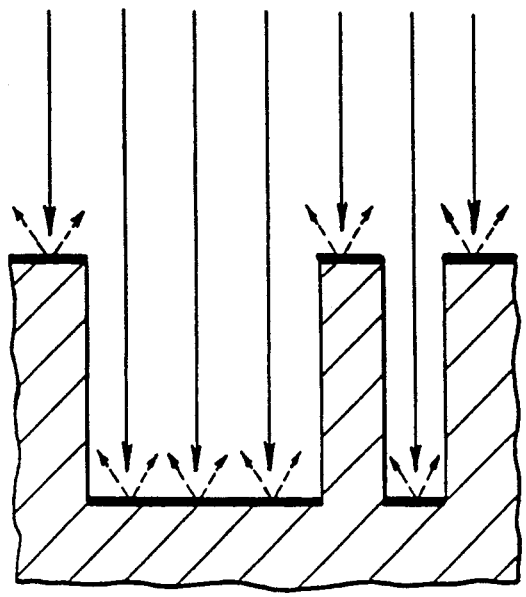
FIGS. 5(a) and 5(b) show the scattering properties obtained by using a directional CVD ($s_r < 1.0$) beam in accordance with the invention at a specified angle to a trench structure, at normal incidence in FIG. 5(a) and at oblique incidence in FIG. 5(b).
Figure 5B:
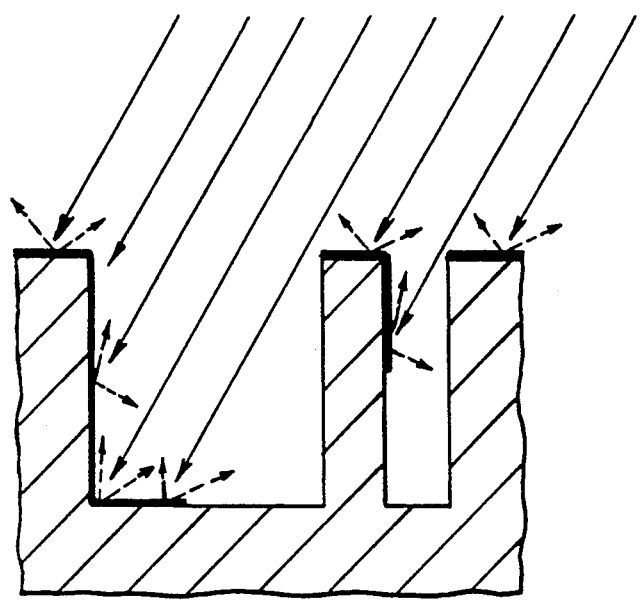
Figure 6:
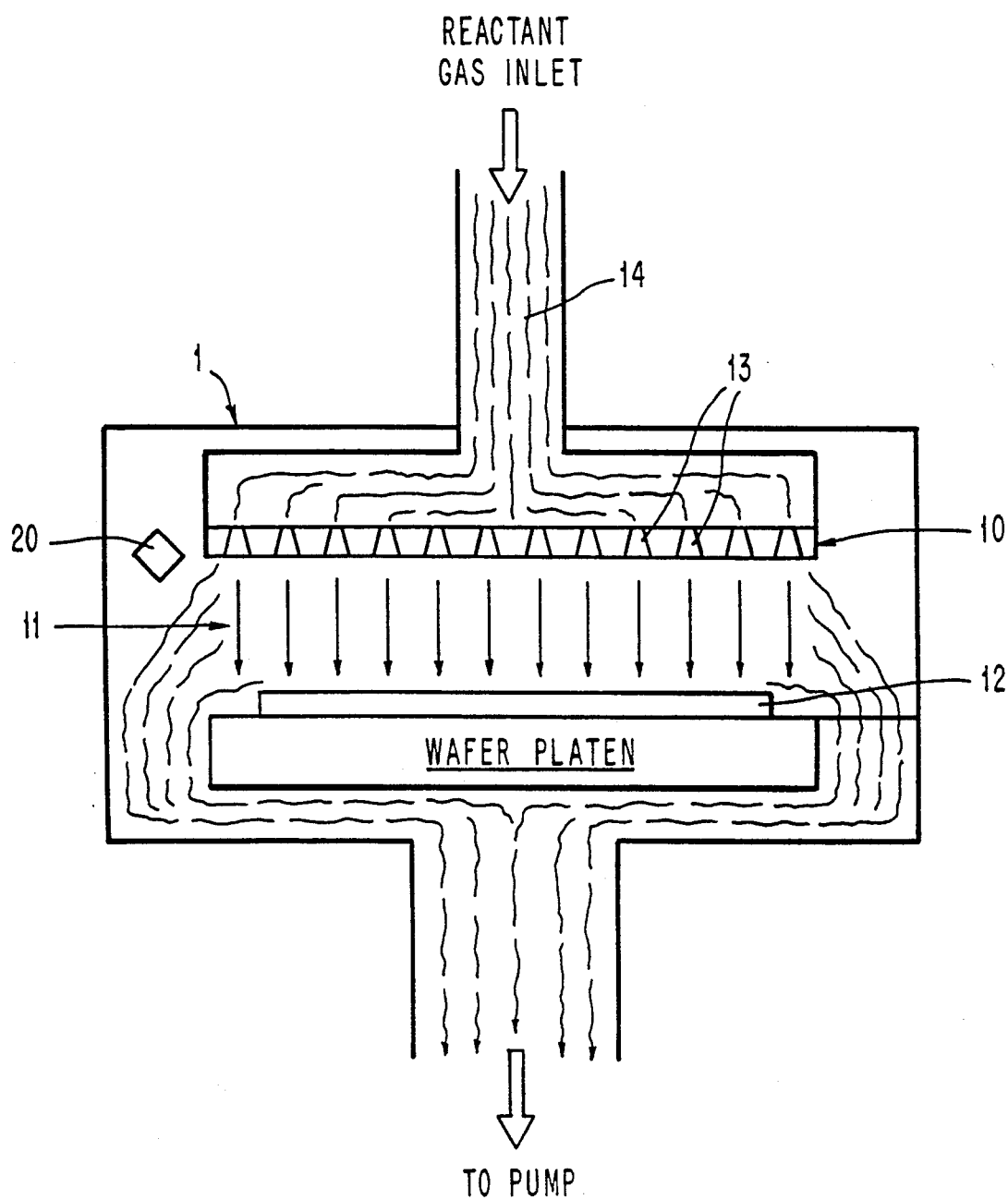
FIG. 6 is a schematic diagram of a reactor configuration for producing a directional low pressure CVD beam in accordance with the invention, showing the beam in the case of normal incidence.
Figure 7A:
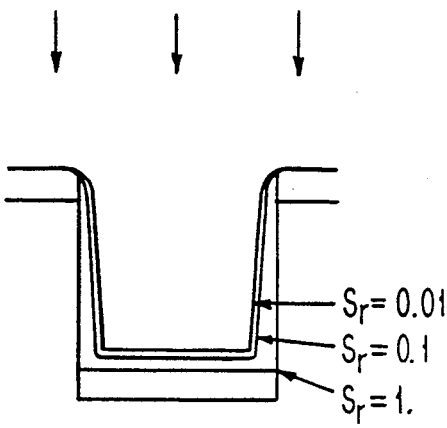
FIGS. 7(a) through 7(d) show the effect of differing degrees of collimation of the beam of the invention on the initial deposition profile for trench features of unity aspect ratio, for (a) perfect collimation, (b) ±30°, (c) ±60°, and (d) no collimation.
Figure 7B:
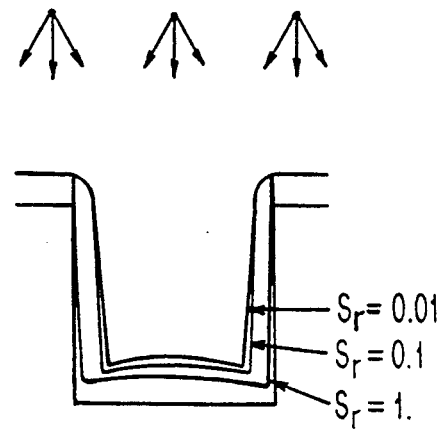
Figure 7D:
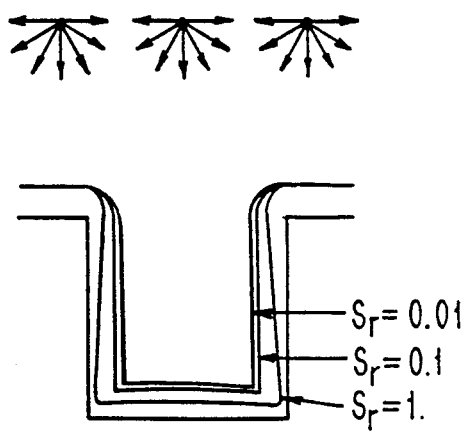
Figure 7C:
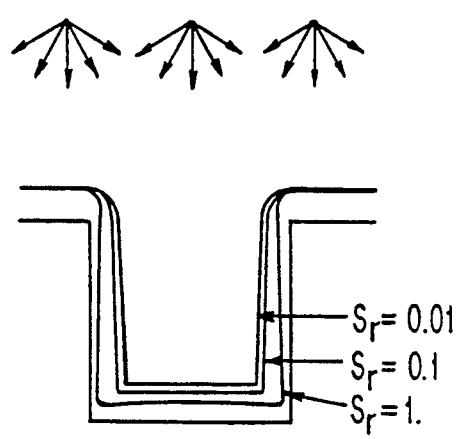

As shown in FIG. 6, the primary modification in conventional LPCVD reactor design needed to accomplish directional LPCVD in accordance with the invention is the addition to the reactor 1 of a reactant collimator 10 which tailors the angular distribution of incident species 11 to the surface on which reactant is to be deposited, such as the surface of a semiconductor wafer 12. In a preferred embodiment, the collimator 10 is a plate perforated by a pattern of apertures or nozzles 13 through which the reactant gas 14 flows. Each such nozzle is designed to cause the reactant to produce a collimated gas beam after leaving the collimator, and may simply be a whole or capillary with relatively high aspect ratio, e.g., length/width=2.0 or more.

In an alternate embodiment, the collimator may consist of a structure normally referred to as a showerhead, which is commonly utilized in CVD process equipment to achieve uniform impingement density across the wafer and which may be adapted for use in accordance with the invention.

Those skilled in the art will recognize that other, and more sophisticated nozzle designs may be used to achieve more effective collimation of the incident CVD reactant beam. These may include, for example, holes combined with smaller-diameter apertures, tapered holes, etc. Designs intended for application in collimated sputter deposition may be found suitable for DLPCVD.

It is also contemplated, as indicated in FIG. 6, that other sources 20 of gaseous species from other portions of the process reactor 1 may provide isotropic or directional impingement on the deposition surface. These sources may include the use of multiple collimated beams, multiple collimators, or a distributed array of collimators utilizing the same or different gases.

Additionally, the chosen embodiment may include the capability of preheating the collimator or showerhead section, which feature can be accomplished by a number of well-known techniques. The primary objective is a technique that will prevent excessive condensation, reaction, or film buildup on the nozzles so that the collimator will not need frequent reconditioning or cleaning. This feature will also make a reactant, which does not pass through a nozzles and is reflected or desorbed primarily upstream of the nozzle, available for a second try, so that the reactant will be efficiently used. Further, collimator heating will cause some heating of the reactant gas, which may enhance the deposition rate or otherwise improve the process itself.

Calculations simulating molecular ballistics of the impingement and scattering of a chemical beam of a modest degree of collimation demonstrate that the process advantages of DLPCVD can be achieved with even a modest degree of collimation of the incident beam. This is shown in FIGS. 7(a) through 7(d), which depict (a) perfect collimation, (b) $\pm 20°$, (c) $\pm 60°$, and (d) no collimation. Clearly, tapered sidewall profiles are achieved for a broad range of $s_r$ with $\pm 30°$ collimation, as well as for $\pm 60°$ collimation, if $s_r$ is small. This means that collimator design requirements are relaxed. Higher degrees of collimation are needed for higher aspect ratio trench and via structures.

For some (not all) chemical systems, $s_r$ decreases as the surface reaction leads to surface products or intermediates which cover the surface and may effectively passivate the surface against adsorption of further reactant molecules impinging from the beam. Then $s_r$ would appear to decrease to zero as the reaction proceeds. For such cases the reaction should be carried out under conditions of temperature and pressure such that the steady-state surface coverage of intermediate species is low compared to full or saturation coverage. This is typically achievable by operation at higher temperatures so that neither surface reaction steps or product desorption are rate-limiting, thus assuring that the growth rate of the deposited film and its three-dimensional profile are determined by the directionality of the impinging beam.

Two examples serve to demonstrate the kinds of 3-D shape modification that can be achieved using the present invention. These modifications will be described by modeling calculations which assume unidirectional incoming flux distribution and diffuse surface scattering, and calculate continuous stages of the deposition profile on 3-D trench features.

The first example, shown in FIGS. 8(a) and 8(b), illustrates the unique trench filling capability which can be obtained for normal incidence reactant flux. FIG. 8(a) shows deposited profiles for trench structures with aspect ratios of unity, and FIG. 8(b) shows the same for aspect ratios of 20, both calculated for various sticking coefficients for CVD reactant flux normal to the macroscopic surface. Note that for $s_r<1.0$ the coverage is greater at the bottom portion of the sidewall than at the top, and that the trench bottom coverage is greater than that on the top surface. With $s_r=1.0$ (physical vapor deposition), the deposited amount is identical on the top surface and on the trench bottom, with no deposition occurring on the sidewalls of the trench. With lower $s_r$ two important effects are evidence. First, the sidewalls are not only covered due to $s_r<1.0$, but the coverage at the bottom portion of the sidewall is greater than that at the top of the sidewall. This result is opposite from what would normally occur with an isotropic (non-directional) reactant beam. The greater coverage near the sidewall bottom is caused by its closer proximity to the trench bottom, where reflected reactant within the trench originates.

Second, the coverage on the trench bottom exceeds that on the top surface of the wafer. Again, this is not only a consequence of $s_r<1.0$, but of the directional impingement of CVD reactants: reflected species from the top surface essentially leave the system, while those reflected at the trench bottom can be again reflected at the trench sidewalls, thus providing a channel to bring them finally to the trench bottom again.

Consequently, normal incidence reactant impingement using directional low pressure CVD offers the following advantages:

The capability of producing trench, via, and sidewall coverage with tapered profile, i.e., higher sidewall coverage at the bottom than at the top of the trench sidewall;

The reduced tendency for seam and/or void formation in trench/via filling applications due to tapered sidewall deposition shape;

The enhanced ability to cover and/or fill re-entrant trenches/vias, i.e., lower sidewall coverage at the bottom of the trench sidewall;

The ability to cover the trench/via bottom and the bottom region of the sidewall preferentially;

Improved trench fill at low temperatures, since higher surface mobility may not be needed to distribute the deposit to bottom regions of trench/via structures;

The capability of providing higher coverage at the trench/via bottom than at the top surface, which may be useful for enhanced planarization schemes;

The ability to employ lower $s_r$ chemistries at given deposition rates for filling applications, since the bidrectional beam enhances the portion which reaches the bottom of the trench.

A second example, shown in FIG. 9, is that of oblique angles directional CVD. FIG. 9 shows deposited profiles for trench structures with aspect ratios of unity, calculated at various sticking coefficients for CVD reactant flux oblique to the macroscopic surface (at 45° angle of incidence). Note that the sidewall coverage is asymmetric, resulting from preferential impingement from one side, which is effective in producing asymmetry. The amount deposited on the sidewall facing the beam source exceeds that on those shadowed to the beam source, and the vertical dependence of sidewall coverage depends on the specific aspect ratio of the trench and angle of impingement of the beam onto the macroscopic wafer surface. The former result opens the possibility of distinguishing some sidewalls from others, especially since isotropic dry or wet etching back of the deposited film can be used to completely remove the deposited film from the shadowed sidewall but leave a substantial thickness on the facing sidewall. If it is desired to produce thicker layers on sidewalls facing other directions, or on all sidewalls, this may be accomplished either through multiple beam sources, or more simply by rotating the wafer. Thus, oblique incidence reactant impingement using directional low pressure CVD offers the following advantages:

The capability of producing deposits (combined with etch-back) on a subset of sidewalls facing the beam source;

The capability of producing deposits primarily on the top portion of sidewalls (near glancing incidence of beam to macroscopic surface)

These advantages can be combined with other processes (isotropic deposition, isotropic or anisotropic etching, etc.) to fabricate a broader array of structural characteristics. It is contemplated that the invention may be used to prevent "worm-hole" formation in tungsten CVD deposition on silicon, i.e., the encroachment of the silicon substrate during deposition.

The process of the invention broadly incorporates the following features:

using a gaseous beam to produce material deposition on a surface;

collimation of the impinging beam, such that the beam flux is directional rather than isotropic;

arranging a specific angle of incidence of the beam onto the surface;

choosing of the beam species such that its reaction probability with the surface is less than 100%; and using a low pressure environment for the process, such that beam directionality is maintained on a length scale up to and including the dimension between the collimating means and the surface where deposition is to take place.

In any particular embodiment of the invention the collimation of the beam may be in the range of approximately ±60° or less. The angle of incidence of the beam onto the surface may be 0°, i.e., normal incidence or some oblique angle between 0° and 90°. The beam species may be those utilized in chemical vapor deposition processes, such as silanes and chlorosilanes, organometallic and organosilicon species, metal fluorides, dopant precursors, known precursors for chemical vapor deposition, or other volatile species. More particularly, the beam species may be silane, higher silanes, clorosilanes, $B_2H_6$, $PH_3$, or $AsH_3$, tetraethylorthosiloxane (commonly known as TEOS) and related species, $WF_6$, $TiCl_4$, $NH_3$, $N_2$, $O_2$, $O_3$, or $H_2O$, and combinations thereof.

The process environment for the beam and surface should be such that the total pressure is less than or equal to 1 torr, and preferably in the range from about 0.1 millitorr to 500 millitorr. The process parameters may be chosen from among typical CVD conditions of pressure and temperature, favoring higher temperatures and lower pressures to assure that the reactive sticking probability maintains its value as deposition proceeds, so that the deposited profile reflects the directional characteristics of the impinging beam. For example, the surface temperature may be in the range from about room temperature to 1100° C., and preferably in the range from about 250° to 750° C.

The appropriate pressure and temperature conditions may first be established and then appropriate gas flow conditions initiated, after which the surface or wafer may be introduced into the deposition zone of the reactor. The reactor may consist of a single-wafer reactor for chemical vapor deposition processes, or plasma-enhanced chemical vapor deposition processes, as practiced commercially, modified to achieve directionality of the impinging beam on the surface, such as by a showerhead arrangement as shown in FIG. 6. Other gases may be added to the gas stream delivered to the collimator, which other gases may be either reactive species (such as CVD precursors) or inert carrier species (such as helium, argon, nitrogen, or hydrogen). Other gaseous species from other portions of the process reactor may provide isotropic or directional impingement on the surface; this feature could include the use of multiple collimated beams, multiple collimators, or a distributed array of collimators utilizing the same or different gases.

The invention is clearly distinguishable from several other processing approaches:

DLPCVD differs distinctly from conventional low pressure CVD in its use of a directional impinging reactant beam. In comparison with atmospheric pressure CVD (APCVD), it has the additional distinction of a different pressure regime (molecular flow).

DLPCVD also differs from gas source molecular beam epitaxy (or metallo-organic molecular beam epitaxy), MBE, in the fact that DLPCVD employs pressure regimes and reactor construction only slightly modified from those for CVD. This means that deposition rates accessible with DLPCVD will be substantially above those of MBE. Finally, DLPCVD utilizes a specific beam collimation technique (e.g., capillaries), while MBE typically employs large source-to-wafer distance to effect collimation.

DLPCVD differs from all physical vapor deposition techniques (evaporation, sputter-deposition, and molecular beam epitaxy) in that the reaction probability for gas species impinging on the deposition surface is generally less than unity or 100%, i.e., the reactive sticking coefficient $s_2 < 1.0$.

While the invention has been described with reference to preferred embodiments thereof, it will be understood by those skilled in the art that various changes in form and details may be made without departing from the teaching and scope of the invention.

What is claimed is:

1. A system for controlling the thickness profile of deposited thin film layers over three-dimensional topography, comprising:
    means for providing a gaseous reactant beam to product material deposition on a surface;
    means for collimating said beam, such that the beam flux is directional rather than isotropic;
    means for arranging a specific angle of incidence of said beam onto the surface;
    means for providing a beam species such that the reaction probability of said beam with the surface is less than 100%;
    means for producing a low pressure environment for said beam and said surface, such that beam directionality is maintained on a length scale up to and including the dimension between said collimating means and said surface where deposition is to take place.

2. A system as in claim 1 wherein said collimating means causes the collimation of said beam to be approximately ±60° or less.

3. A system as in claim 1 wherein said collimating means comprises means for passing said beam through a set of apertures designed to achieve directionality of the beam to produce collimation.

4. A system as in claim 3 wherein said beam passing means comprises a set of nozzles.

5. A system as in claim 1 wherein said means for providing a beam species comprises means for adding at least one of reactive species and inert carrier species to said beam.

6. A system as in claim 1 wherein said means for providing a beam species provides beam species selected from the group consisting of silanes and chlorosilanes, organometallic and organosilicon species, metal fluorides, dopant precursors, known precursors for chemical vapor deposition, other volatile species, and combinations thereof.

7. A system as in claim 1 wherein said beam species are selected from the group consisting of silane, higher silanes, chlorosilanes, $B_2H_6$, $PH_3$, $AsH_3$, tetraethylorthosiloxane (commonly known as TEOS), $WF_6$, $TiCl_4$, $NH_3$, $N_2$, $O_2$, $O_3$, $H_2O$, and combinations thereof.

8. A system as in claim 1 wherein said collimating means comprises means for directing said beam onto said surface with an angle of incidence of 0°.

9. A system as in claim 1 wherein said collimating means comprises means for direction said beam onto said surface with an oblique angle of incidence between 0° and 90°.

10. A system as in claim 1 wherein said means for producing a low pressure environment for said beam comprises means for producing a total pressure of less than or equal to 1 torr.

11. A system as in claim 1 wherein said means for producing a low pressure environment for said beam comprises means for producing a total pressure in the range from about 0.1 millitorr to 500 millitorr.

12. A system as in claim 1 wherein said means for producing a low pressure environment for said beam comprises means for producing a surface temperature in the range from room temperature to 1100° C.

13. A system as in claim 1 wherein said means for producing a low pressure environment for said beam comprises means for producing a surface temperature in the range from about 250° to 750° C.

14. A system as in claim 1 further comprising means for adding another gaseous species to said low pressure environment, to provide additional isotropic or directional impingement on said surface.

15. A system as in claim 1 further comprising means for heating said collimating means.

* * * * *